(12) United States Patent
Blanchet et al.

(10) Patent No.: US 8,715,906 B2
(45) Date of Patent: May 6, 2014

(54) HIGH RESOLUTION, SOLVENT RESISTANT, THIN ELASTOMERIC PRINTING PLATES

(75) Inventors: Graciela Beatriz Blanchet, Boston, MA (US); Gary Delmar Jaycox, West Chester, PA (US); Nancy G. Tassi, Gibbstown, NJ (US)

(73) Assignee: E I du pont de Nemours and Company, Wilmington, DE (US)

( * ) Notice: Subject to any disclaimer, the term of this patent is extended or adjusted under 35 U.S.C. 154(b) by 368 days.

(21) Appl. No.: 12/636,072

(22) Filed: Dec. 11, 2009

(65) Prior Publication Data

US 2010/0151387 A1 Jun. 17, 2010

Related U.S. Application Data

(60) Provisional application No. 61/122,053, filed on Dec. 12, 2008.

(51) Int. Cl.
*G03F 7/027* (2006.01)
*G03F 7/028* (2006.01)
*G03F 7/09* (2006.01)
*B41N 1/06* (2006.01)

(52) U.S. Cl.
USPC ............... 430/271.1; 430/281.1; 430/302; 430/306; 101/453; 101/463.1

(58) Field of Classification Search
USPC ......... 430/270.1, 271.1, 273.1, 14, 15, 281.1, 430/300, 302, 306
See application file for complete search history.

(56) References Cited

U.S. PATENT DOCUMENTS

| | | | |
|---|---|---|---|
| 3,055,932 A | | 9/1962 | Verbanic et al. |
| 5,258,263 A | * | 11/1993 | Cheema et al. ............... 430/309 |
| 5,534,391 A | * | 7/1996 | Wang .......................... 430/271.1 |
| 5,804,353 A | * | 9/1998 | Cushner et al. ............... 430/306 |
| 2003/0165768 A1 | * | 9/2003 | Hotta et al. ................... 430/146 |
| 2007/0228893 A1 | * | 10/2007 | Yamauchi et al. ............. 310/348 |

FOREIGN PATENT DOCUMENTS

EP 0 665 469 A2 8/1995

* cited by examiner

*Primary Examiner* — Anca Eoff

(57) ABSTRACT

The present invention relates a printing element comprising at least one polymer layer which has photoimageable constituents and additions to make the polymer layer either hydrophobic or hydrophilic.

7 Claims, 2 Drawing Sheets

HIGH RESOLUTION, SOLVENT RESISTANT, THIN ELASTOMERIC PRINTING PLATES

FIELD OF THE INVENTION

The present invention relates to a printing element comprising at least one polymer layer which has photoimageable constituents and additions to make the polymer layer either more hydrophobic or hydrophilic. The printing element may have two polymer layers on a substrate in which one of the layers comprises fluorinated acrylates or methacrylates.

BACKGROUND

Verbanic et al (U.S. Pat. No. 3,055,932) discloses unsaturated esters of fluorinated glycols and acyl halides. It discloses preparation of compositions of matter which are useful in the formation of polymeric materials for high temperature applications.

The present invention is directed to an article comprising at least one layer of polymer deposited on a substrate wherein the layer contains fluorinated compounds or additives that adjust the relative hydrophobicity of the layers.

BRIEF DESCRIPTION OF THE DRAWINGS AND FIGURES

SUMMARY OF THE INVENTION

Figure 1A:
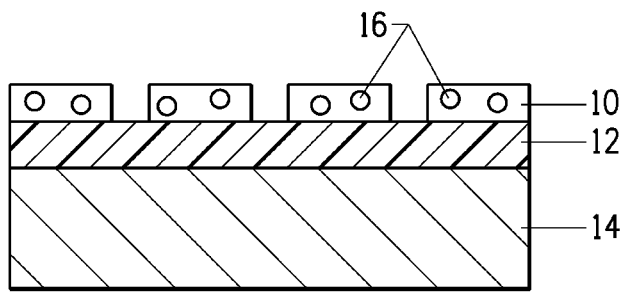
FIGS. 1A and 1B illustrate a bi-layer structure for differential inking.

The invention is directed to an article comprising:
a) a substrate
b) a first polymer layer disposed on the substrate wherein the first polymer layer comprises:
  i) an elastomeric polymer; and
  ii) a initiator; and
c) second polymer layer disposed on the first polymer layer wherein the second polymer layer comprises
  i) an elastomeric polymer; and
  ii) a photoinitiator; and
wherein the first polymer layer or the second polymer layer further comprises a polymer of monomers selected from the group consisting of:

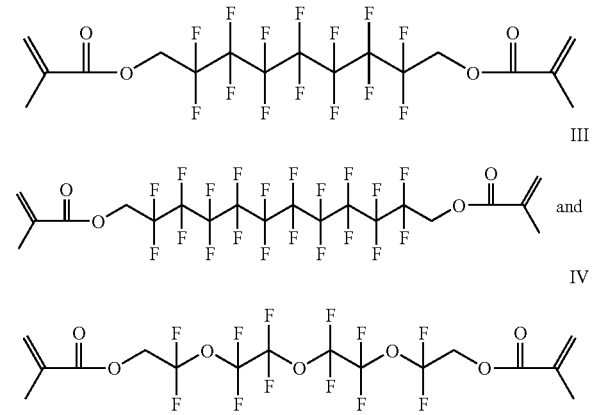

and mixtures thereof; and
wherein the polymer layer that does not contain the polymer of the monomers contains a polymer of non-fluorinated acrylate or methacrylate monomers.

The invention is further directed to an article comprising:
a) a substrate
b) a first polymer layer disposed on the substrate wherein the a first polymer layer comprises
  i) an elastomeric polymer;
  ii) an initiator; and
  iii) a monomer selected from non-fluorinated acrylate or methacrylate monomers;
c) a second polymer layer disposed on the first polymer layer wherein the a second polymer layer comprises
  i) an elastomeric polymer;
  ii) a photoinitiator; and
  iii) a monomer selected from a non-fluorinated acrylate or methacrylate monomers;
wherein the first or the second polymer layer comprises fluorinated additives.

The invention is still further directed to a process comprising:
a) providing a substrate
b) depositing a first polymer layer on the substrate, the first polymer layer comprising
  i) an elastomeric polymer;
  ii) an initiator; and
  iii) non-fluorinated acrylate or methacrylate monomers
c) crosslinking the first polymer layer;
d) depositing a second polymer layer on the first polymer layer, the second polymer layer comprising;
  i) an elastomeric polymer;
  ii) a photoinitiator; and
  iii) monomers selected from the group consisting of:

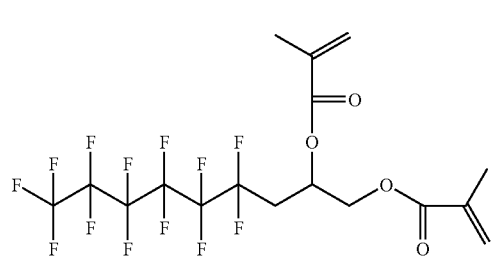

-continued

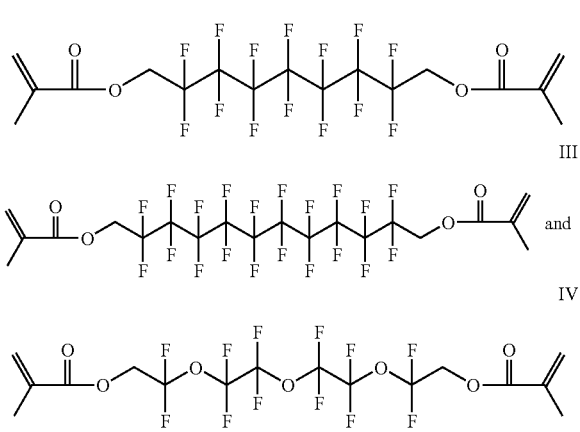

and mixtures thereof;
e) imaging a pattern on the second polymer layer forming an imaged pattern; and
f) developing the imaged pattern.
The invention is also directed to a process comprising:
a) providing a substrate;
b) depositing a first polymer layer on the substrate wherein the first polymer layer comprises
  i) an elastomeric polymer;
  ii) a initiator;
  iii) monomers selected from the group consisting of:

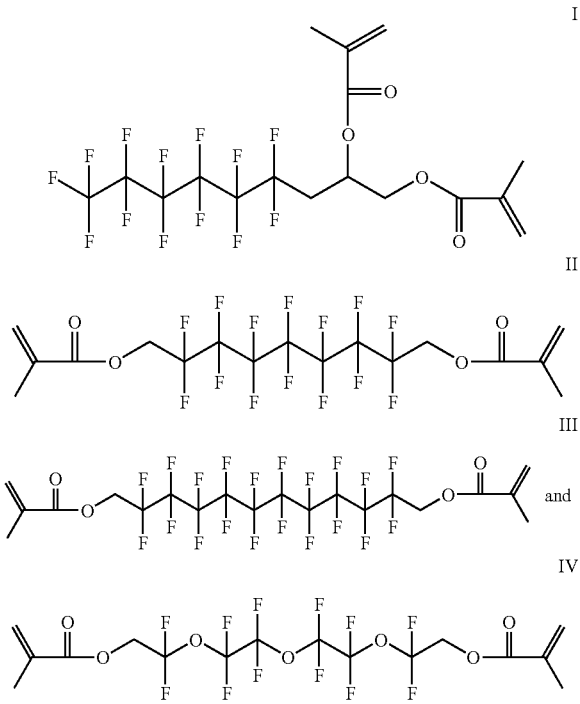

and mixtures thereof;
c) crosslinking the first polymer layer;
d) depositing a second polymer layer on the first polymer layer wherein the second polymer layer comprises;
  i) an elastomeric polymer;
  ii) a photoinitiator; and
  iii) monomers selected from non-fluorinated acrylate or methacrylate;
e) imaging a pattern on the second polymer layer forming an imaged pattern; and
f) developing the imaged pattern.

DETAILED DESCRIPTION

In a standard imaged and processed flexographic printing plate, the difference in height (Δh) between the uppermost relief features and the floor of the plate typically ranges from about 100-500 microns. This dimension depends upon the desired size of the relief features and other specifics unique to the printing plate. When plates are intended to be used for high resolution printing applications (i.e. printing in the micron range), the value of Δh must be reduced so as to be comparable to the plate's very small feature sizes. Typically, the Δh-to-feature size ratio falls near unity for most high resolution printing processes. Unfortunately, the reduction in Δh tends to compromise the plate's mechanical durability and its elastomeric behavior that is required for good conformal contact between the plate and the object to be printed. One solution to this limitation involves the fabrication of a bi-layer construct that has both a photo- or a thermo-crosslinkable elastomeric floor layer providing for good mechanical properties and a thin photo-imageable elastomeric layer that is sequentially deposited on top that contains the desired relief features arranged in a pattern. In this way, the properties of the two layers can each be optimized separately so that the bottom layer adjacent to the substrate controls the plate's elastic modulus for optimal printing while the thin upper layer (with Δh~desired feature size) controls the plate's printing resolution.

Bi-layer plates that are fabricated in this manner can be designed for differential inking with hydrophilic inks. Here, the printing plate comprises a flexible support or substrate and two additional crosslinkable elastomeric layers of essentially the same composition that have very different surface energies. Both of these additional layers would comprise elastomeric photopolymer compositions and one of these layers would also contain fluorinated nanoparticles, fluorinated additives (e.g. Zonyl® fluorosurfactants, DuPont, Wilmington, Del.), fluorinated telomers or fluorinated acrylate or methacrylate crosslinking monomers. The fluorine containing layer could be chosen to be at the top or at the bottom of the bi-layer printing plate. If the fluorine containing layer is at the top, the bottom layer would selectively ink with hydrophilic inks. On the other hand, if the fluorine modified layer is at the bottom, the top layer would selectively ink when hydrophilic inks are used. In either of these cases, good printing resolution is achieved because the relatively more hydrophobic fluorinated portions of the plate are not wetted by the ink while the other more hydrophilic areas are wetted by the ink.

Figure 1B:
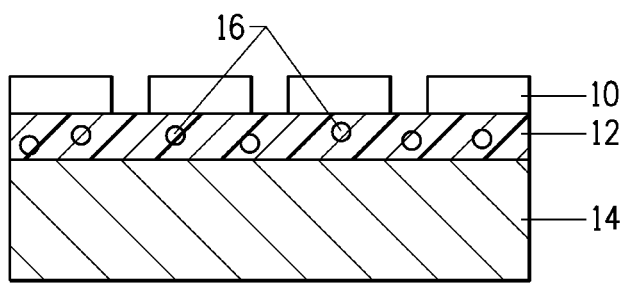
Figure 2A:
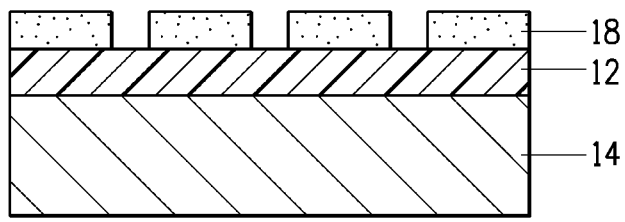
FIGS. 2A and 2B illustrate a bi-layer structure for differential inking.
Figure 2B:
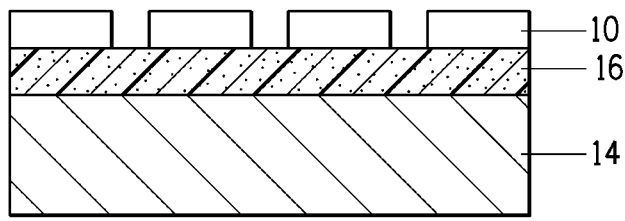

These concepts are illustrated in FIGS. 1 and 2. FIG. 1A shows a bi-layer printing plate containing fluorinated additives or fluorinated particles (16) that operates in a Gravure mode with hydrophilic inks where (14) is a support layer, (12) is a photo- or a thermally crosslinked elastomeric layer and (10) is a photo-crosslinked elastomeric layer containing fluorinated additives or particles that was exposed to actinic radiation through a photo-mask (imaged) and then subsequently developed to remove non-crosslinked material to form a pattern. FIG. 1B shows a bi-layer printing plate containing fluorinated additives or fluorinated particles (16) that operates in a flexographic mode with hydrophilic inks where (14) is a support layer, (12) is a photo- or a thermally crosslinked elastomeric layer that contains fluorinated additives or particles and (10) is a photo-crosslinked elastomeric layer that was exposed to actinic radiation through a photo-mask (imaged) and then subsequently developed to remove non-crosslinked material to form a pattern. FIG. 2A shows a bi-layer printing plate containing fluorinated monomers that operates in a Gravure mode with hydrophilic inks where (14) is a support layer, (12) is a photo- or a thermally crosslinked elastomeric layer and (18) is a photo-crosslinked elastomeric layer containing fluorinated crosslinking monomers that was exposed to actinic radiation through a photo-mask (imaged) and then subsequently developed to remove non-crosslinked material to form a pattern. FIG. 2B shows a bi-layer printing plate containing fluorinated monomers that operates in a flexographic mode with hydrophilic inks where (14) is a support layer, (16) is a photo- or a thermally crosslinked elastomeric layer that contains fluorinated crosslinking monomers and (10) is a photo-crosslinked elastomeric layer that was exposed to actinic radiation through a photo-mask (imaged) and then subsequently developed to remove non-crosslinked material to form a pattern.

Gravure or flexographic bi-layer printing plates that can be selectively inked with hydrophobic inks can be fabricated in a similar manner. In this case, both layers of the bi-layer plate would also comprise crosslinked elastomeric photopolymer compositions and one of the layers would also contain hydrophilic additives like ionic surfactants or particles of silica, alumina or titanium dioxide, or acrylate or methacrylate crosslinking monomers fitted with hydrophilic (e.g. hydroxyl carboxylic acid) functional groups. If the upper layer contained the hydrophilic additives or functional groups, the bottom layer of the bi-layer plate would selectively ink when contacted by hydrophobic inks. Conversely, if the hydrophilic layer is at the bottom, the upper layer of the plate would selectively ink when hydrophobic inks are employed. Again, good printing resolution is achieved because the relatively more hydrophilic portions of the bi-layer plate are not wetted by the hydrophobic ink while the other more hydrophobic areas of the plate are wetted by the ink.

Depending upon the particular application desired, the target resolution for high resolution printing plates can be in the range of 1-15 microns. Printing electronic devices using a reel-to-reel process requires the ability to print high resolution lines and spaces. The source-drain level of a thin film transistor is particularly demanding because the channel lengths required for good transistor performances are on the order of only a few microns. Currently it is not possible to print at these micron resolutions using available materials and/or processes. Standard printing plates do not have nearly the required resolution. In contrast, molded polydimethylsiloxane (PDMS) plates can reach these resolutions but are typically limited to printing thiol layers.

Bi-layer plates are described which are fabricated from commercially available block copolymers like poly(styrene-butadiene-styrene) or poly(styrene-isoprene-styrene) elastomers that have been mixed with smaller crosslinkable acrylate or methacrylate monomers. These polymerizable mixtures furnish robust, semi-interpenetrating networks (SIPNs) when crosslinked thermally or photochemically. The SIPN layers that result are elastomeric in their mechanical behaviors and form the two working layers contained in the bi-layer plate where one of the layers also contains hydrophobic or hydrophilic additives and/or monomers to modify its surface energy relative to the other layer. The two SIPN layers formed in this manner are chemically resistant to many solvents and dispersants that are used in standard ink formulations, including ethanol, aqueous alcohol mixtures, toluene and ortho-dichlorobenzene. Moreover, because the two SIPN layers contain many of these same chemical components, inter-layer adhesion between the two adjacent layers can be maintained. In addition to poly(styrene-butadiene-styrene) or poly(styrene-isoprene-styrene) elastomers, other elastomeric polymers and rubbers can also be used to form the two polymeric SIPN layers in the bi-layer plate, including various copolymers of butadiene with acrylonitrile and neoprene rubbers.

One embodiment of the present invention is an article which may be used as a printing element. In this embodiment, the substrate is selected to be relatively hydrophilic. The substrate may be Mylar® (DuPont Teijin Films, Bristol, UK). A relatively hydrophobic polymer layer is deposited on the substrate. The polymer layer may be deposited by spin coating, bar coating, spraying, dipping or similar coating technologies known to one skilled in the art. The polymer layer comprises a block copolymer of styrene-butadiene-styrene or styrene-isoprene-styrene and photoimaging constituents. Appropriate photoimaging constituents may include photoinitiators and/or photosensitizers among others. The polymer layer also comprises a polymer of the monomers selected from the group consisting of:

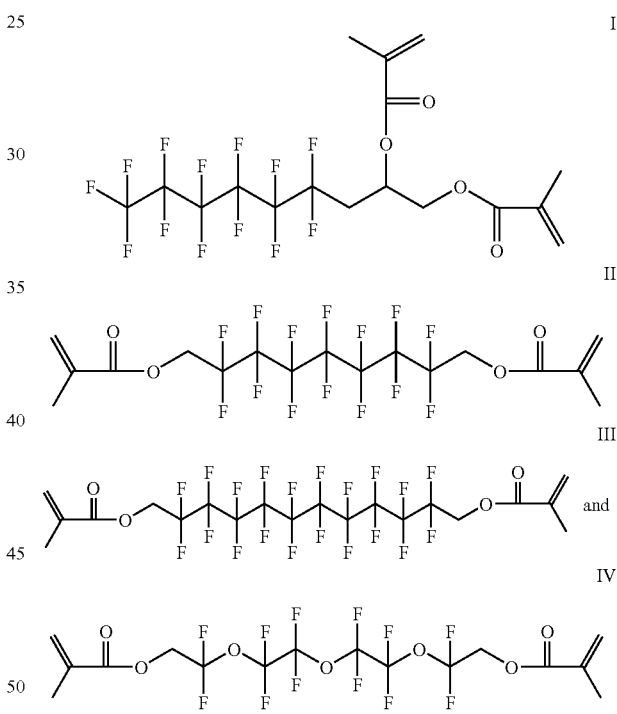

and mixtures thereof.

The polymer layer may optionally further comprise fluorinated additives such as Zonyl® fluorosurfactants (DuPont, Wilmington Del.) or fluorinated particles. In this embodiment, the substrate is relatively hydrophilic while the polymer layer is hydrophobic due to the incorporation of the fluorinated monomers and/or fluorinated additives.

A second embodiment of the present invention is an article which may be used as a printing element. In this embodiment, the substrate is selected to be relatively hydrophobic. The substrate may be plasma treated polytetrafluoroethylene or another plasma treated fluoropolymer. A polymer layer is deposited on the substrate. The polymer layer comprises a block copolymer of styrene-butadiene-styrene or styrene-isoprene-styrene and photoimaging constituents. Appropriate photoimaging constituents may include photoinitiators and/or photosensitizers among others. The polymer layer may optionally comprise hydrophilic additives such as ionic surfactants or hydrophilic particles of silica, alumina or titanium dioxide. The polymer layer further comprises a polymer of non-fluorinated (meth)acrylate monomers that contain hydrophilic substituents such as hydroxyl or carboxylic acid groups. In this embodiment, the substrate is hydrophobic while the polymer layer relatively hydrophilic.

A third embodiment of the present invention is an article which may be used as a printing element. In this embodiment, the substrate may be any material that may be coated. A first polymer layer is deposited on the substrate. The first polymer layer may be deposited by any known coating technique. The first polymer layer comprises a block copolymer of styrene-butadiene-styrene or styrene-isoprene-styrene and initiator. The initiator may be Irgacure® 907 (2-Methyl-1-[4-(methylthio)phenyl]-2-(4-morpholinyl)-1-propanone) (Ciba Specialty Chemicals, Basel, Switzerland). A second polymer layer is deposited onto the first polymer layer. The second polymer layer comprises a block copolymer of styrene-butadiene-styrene or styrene-isoprene-styrene and photoimaging constituents. Appropriate photoimaging constituents may include photoinitiators and/or photosensitizors among others. Either the first polymer layer or the second polymer layer, but not both, also comprises a polymer of the monomers selected from the group consisting of:

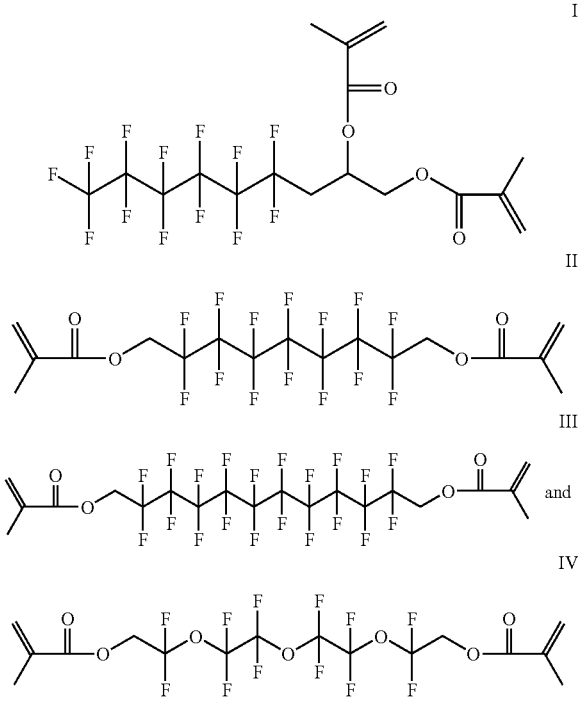

and mixtures thereof.

The polymer layer which comprises the polymer formed from the monomers above may optionally further comprise fluorinated additives such as Zonyl® fluorosurfactants (DuPont, Wilmington Del.) or fluorinated particles. The polymer layer that does not contain the polymer of the monomers contains a polymer of non-fluorinated acrylate or methacrylate crosslinking monomers.

A fourth embodiment of the present invention is an article which may be used as a printing element. In this embodiment, the substrate may be any material which may be coated. A first polymer layer is deposited on the substrate. The first polymer layer may be deposited by any known coating technique. The first polymer layer comprises a block copolymer of styrene-butadiene-styrene or styrene-isoprene-styrene and initiator. The initiator may be Irgacure® 907 (Ciba Specialty Chemicals, Basel, Switzerland). A second polymer layer is deposited onto the first polymer layer. The second polymer layer comprises a block copolymer of styrene-butadiene-styrene or styrene-isoprene-styrene and photoimaging constituents. Appropriate photoimaging constituents may include photoinitiators and/or photosensitizors among others. Both the first and the second polymer layer also comprise a polymer of non-fluorinated acrylate or methacrylate monomers. The non-fluorinated (meth)acrylate monomers may be trimethylolpropane triacrylate (TMPTA), ethoxylated trimethylolpropane triacrylate (TMPEOTA) and/or 1,12-dodecanediol dimethacrylate (Sartomer CD262). Furthermore, either the first polymer layer or the second polymer layer, but not both, also comprises fluorinated particles or fluorinated additives that include Zonyl® fluorosurfactants (DuPont, Wilmington Del.).

A fifth embodiment of the present invention is an article which may be used as a printing element. In this embodiment, the substrate may be any material which may be coated. A first polymer layer is deposited on the substrate. The first polymer layer may be deposited by any known coating technique. The first polymer layer comprises a block copolymer of styrene-butadiene-styrene or styrene-isoprene-styrene and initiator. The initiator may be Irgacure® 907 (Ciba Specialty Chemicals, Basel, Switzerland). A second polymer layer is deposited onto the first polymer layer. The second polymer layer comprises a block copolymer of styrene-butadiene-styrene or styrene-isoprene-styrene and photoimaging constituents. Appropriate photoimaging constituents may include photoinitiators and/or photosensitizors among others. Both the first polymer layer and the second polymer layer also comprise a polymer of non-fluorinated acrylate or methacrylate monomers. The non-fluorinated (meth)acrylate monomers may be TMPTA, TMPEOTA and/or Sartomer CD262. Furthermore, either the first polymer layer or the second polymer layer, but not both, also comprises hydrophilic additives like ionic surfactants or particles of silica, alumina or titanium dioxide.

The present invention is also a process to make printing elements. In one embodiment, a substrate is provided. The substrate may be Melinex® ST504 (DuPont Teijin Films, Bristol, UK). The next step in the process is depositing a first layer on the substrate. The first layer comprises a block copolymer of styrene-butadiene-styrene or styrene-isoprene-styrene, an initiator and non-fluorinated crosslinking acrylate or methacrylate monomers. The non-fluorinated (meth)acrylate monomers may be TMPTA, TMPEOTA and/or Sartomer CD262. The first layer may be deposited by any known coating technique. The initiator may be di(4-tert-butylcyclohexyl) peroxydicarbonate, Perkadox® 16 (Akzo Nobel) or Irgacure® 907 (Ciba Specialty Chemicals, Basel, Switzerland). The next step in the process is crosslinking the first layer. The crosslinking step may be thermal or, if the initiator is a photoinitiator, the crosslinking step may be by flood irradiation. In the next step of the process, a second layer is deposited onto the first polymer layer. The second layer comprises a block copolymer of styrene-butadiene-styrene or styrene-isoprene-styrene, a photoinitiator and fluorinated monomers selected from the group consisting of:

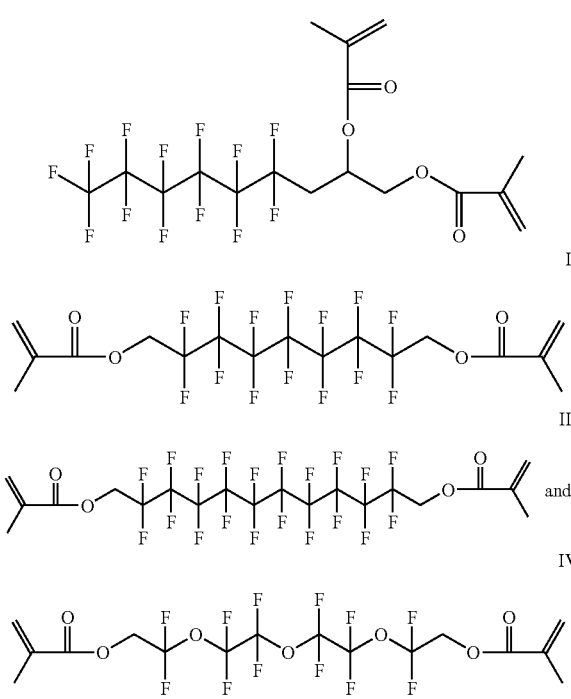

and mixtures thereof.

The photoinitiator may be Irgacure® 907 (Ciba Specialty Chemicals, Basel, Switzerland). The subsequent step in the process is irradiating an image into the second layer. The next step is developing the irradiated image by exposing the second polymer layer to a developing solution which dissolves the non-irradiated portions from the exposed image.

In a second process embodiment, a substrate is provided. The substrate may be Melinex® ST504 (DuPont Teijin Films, Bristol, UK). The next step in the process is depositing a first layer on the substrate. The first layer comprises a block copolymer of styrene-butadiene-styrene or styrene-isoprene-styrene, an initiator and fluorinated monomers selected from the group consisting of:

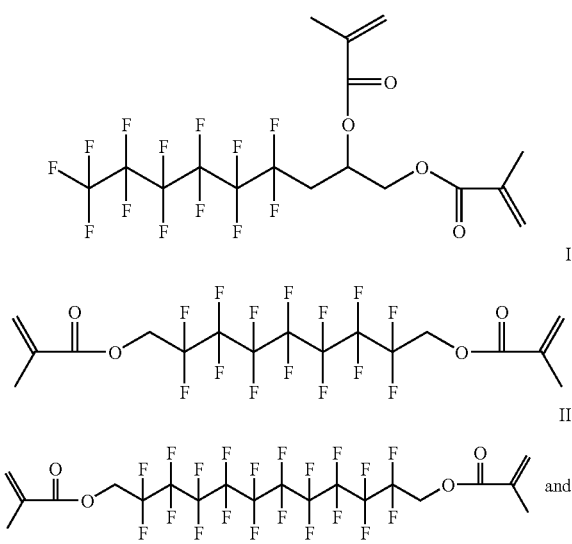

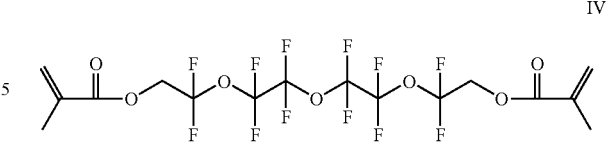

and mixtures thereof.

The first layer may be deposited by any known coating technique. The initiator may be Perkadox® 16 (Akzo Nobel) or Irgacure® 907 (Ciba Specialty Chemicals, Basel, Switzerland). The next step in the process is crosslinking the first layer. The crosslinking step may be thermal or, if the initiator is a photoinitiator, the crosslinking step may be by flood irradiation. In the next step of the process, a second layer is deposited onto the first polymer layer. The second layer comprises a block copolymer of styrene-butadiene-styrene or styrene-isoprene-styrene, a photoinitiator and non-fluorinated crosslinking acrylate or methacrylate monomers. The non-fluorinated (meth)acrylate monomers may be TMPTA, TMPEOTA and/or Sartomer CD262. The photoinitiator may be Irgacure® 907 (Ciba Specialty Chemicals, Basel, Switzerland). The subsequent step in the process is irradiating an image into the second layer. The next step is developing the irradiated image by exposing the second polymer layer to a developing solution which dissolves the non-irradiated portions from the exposed image.

In a third process embodiment of the present invention, a substrate is provided. The substrate may be Melinex® ST504 (DuPont Teijin Films, Bristol, UK). The next step in the process is depositing a first layer on the substrate. The first layer comprises a block copolymer of styrene-butadiene-styrene or styrene-isoprene-styrene, an initiator and non-flourinated crosslinking acrylate or methacrylate monomers. The non-fluorinated (meth)acrylate monomers may be TMPTA, TMPEOTA and/or Sartomer CD262. The deposition of the first layer may be by any known coating technique The initiator may be Perkadox® 16 (Akzo Nobel) or Irgacure® 907 (Ciba Specialty Chemicals, Basel, Switzerland). The next step in the process is crosslinking the first polymer layer. The crosslinking may be thermal or, if the initiator is a photoinitiator, the crosslinking may be by flood irradiation. In the next step of the process, a second layer is deposited onto the first polymer layer. The second polymer layer comprises a block copolymer of styrene-butadiene-styrene or styrene-isoprene-styrene, a photoinitiator and non-flourinated crosslinking acrylate or methacrylate monomers. The non-fluorinated (meth)acrylate monomers may be TMPTA, TMPEOTA and/or Sartomer CD262. The photoinitiator may be Irgacure® 907 (Ciba Specialty Chemicals, Basel, Switzerland. The subsequent step in the process is irradiating an image into the second polymer layer. The next step is developing the irradiated image by exposing the second polymer layer to a developing solution which dissolves the non-irradiated portions of the exposed image. Either the first polymer layer or the second polymer layer, but not both, further comprises fluorinated particles or fluorinated additives that may include Zonyl® fluorosurfactants (DuPont, Wilmington Del.).

In a fourth process embodiment of the present invention, a substrate is provided. The substrate may be Melinex® ST504 (DuPont Teijin Films, Bristol, UK). The next step in the process is depositing a first layer on the substrate. The first layer comprises a block copolymer of styrene-butadiene-styrene or styrene-isoprene-styrene, an initiator and non-flourinated crosslinking acrylate or methacrylate monomers. The non-fluorinated (meth)acrylate monomers may be TMPTA, TMPEOTA and/or Sartomer CD262. The deposition of the first layer may be by any known coating technique The initiator may be Perkadox® 16 (Akzo Nobel) or Irgacure® 907 (Ciba Specialty Chemicals, Basel, Switzerland) The next step in the process is crosslinking the first polymer layer. The crosslinking may be thermal or, if the initiator is a photoinitiator, the crosslinking may be by flood irradiation. In the next step of the process, a second layer is deposited onto the first polymer layer. The second polymer layer comprises a block copolymer of styrene-butadiene-styrene or styrene-isoprene-styrene, a photoinitiator and non-flourinated crosslinking acrylate or methacrylate monomers. The non-fluorinated (meth)acrylate monomers may be TMPTA, TMPEOTA and/or Sartomer CD262. The photoinitiator may be Irgacure® 907 (Ciba Specialty Chemicals, Basel, Switzerland. The subsequent step in the process is irradiating an image into the second polymer layer. The next step is developing the irradiated image by exposing the second polymer layer to a developing solution which dissolves the non-irradiated portions of the exposed image. Either the first polymer layer or the second polymer layer, but not both, further comprises hydrophilic additives like ionic surfactants or particles of silica, alumina or titanium dioxide.

In a fifth process embodiment of the present invention, a relatively hydrophilic substrate is provided. The substrate may be Melinex® ST504 (DuPont Teijin Films, Bristol, UK). The next step in the process is depositing a layer on the substrate. The layer comprises a block copolymer of styrene-butadiene-styrene or styrene-isoprene-styrene, a photoinitiator and fluorinated monomers selected from the group consisting of:

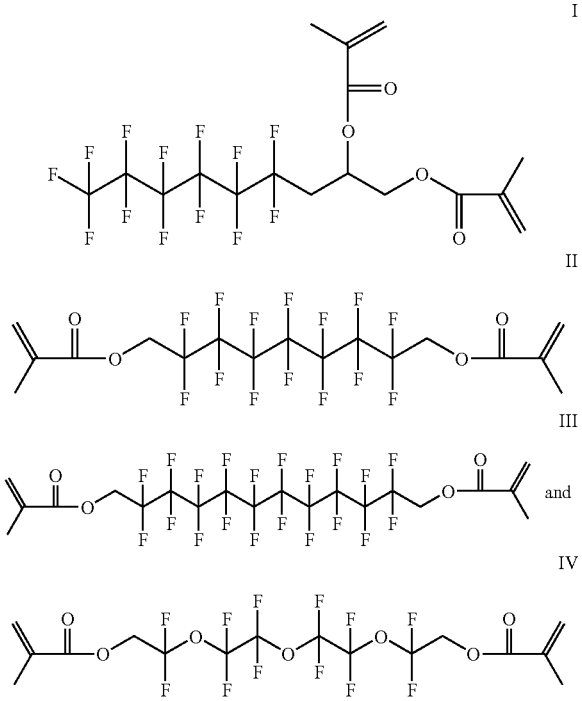

and mixtures thereof.

The photoinitiator may be Irgacure® 907 (Ciba Specialty Chemicals, Basel, Switzerland). The subsequent step in the process is irradiating an image into the layer. The next step is developing the irradiated image by exposing the polymer layer to a developing solution which dissolves the non-irradiated portions from the exposed image.

In a sixth process embodiment of the present invention, a relatively hydrophilic substrate is provided. The substrate may be Melinex® ST504 (DuPont Teijin Films, Bristol, UK). The next step in the process is depositing a layer on the substrate. The layer comprises a block copolymer of styrene-butadiene-styrene or styrene-isoprene-styrene, a photoinitiator, non-fluorinated acrylate or methacrylate crosslinking monomers and fluorinated particles or fluorinated surfactants such as Zonyl fluorosurfactants (DuPont, Wilmington Del.). The non-fluorinated (meth)acrylate monomers may be TMPTA, TMPEOTA and/or Sartomer CD262. The photoinitiator may be Irgacure® 907 (Ciba Specialty Chemicals, Basel, Switzerland). The subsequent step in the process is irradiating an image into the layer. The next step is developing the irradiated image by exposing the polymer layer to a developing solution which dissolves the non-irradiated portions from the exposed image.

In another process embodiment of the present invention, a relatively hydrophobic substrate is provided. The substrate may be plasma treated polytetrafluoroethylene or another plasma treated fluoropolymer. The next step in the process is depositing a layer on the substrate. The layer comprises a block copolymer of styrene-butadiene-styrene or styrene-isoprene-styrene, a photoinitiator, non-fluorinated acrylate or methacrylate crosslinking monomers and hydrophilic surfactants or hydrophilic additives that may include silica, alumina or titanium dioxide particles. The non-fluorinated (meth)acrylate monomers may be TMPTA, TMPEOTA and/or Sartomer CD262. The photoinitiator may be Irgacure® 907 (Ciba Specialty Chemicals, Basel, Switzerland). The subsequent step in the process is irradiating an image into the layer. The next step is developing the irradiated image by exposing the polymer layer to a developing solution which dissolves the non-irradiated portions from the exposed image.

EXAMPLES

Examples 1-9

These examples illustrate the effect of fluorine containing additives on the hydrophilicity of the surface of a thermal sub-layer composition. The non-fluorinated thermally crosslinkable polymer composition with the amount listed below in Table 1 was mixed and stirred at ambient temperature for a minimum of four hours or until the solid components were fully dissolved. 7.2 grams (1 gram solids) of the mixture were weight into 10 ml vials for the addition of the fluorine containing additive. One of three Zonyl fluorosurfactant additives, Z225, FTS or FSN, (DuPont) was added to each vial at the concentration specified in Table 1 and stirred overnight.

Figure 3:
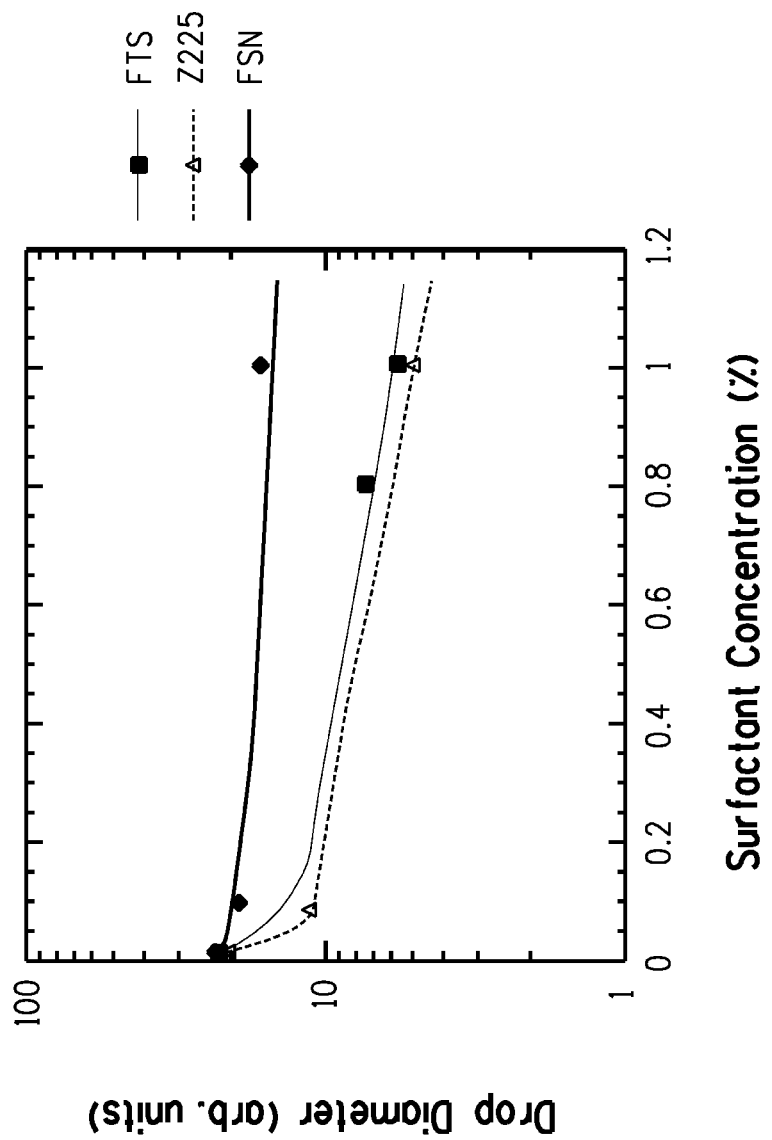
FIG. 3 illustrates drop diameters as a function of concentration of fluorinated surfactants in the polymer layer.

A thin film of each of the compositions was coated onto a clean 2"×2" silicon wafer. The wafer was cleaned as follows; an acetone rinse was followed by a methanol and a DI-water rinse. The wafer was dried with high pressure nitrogen and exposed to an oxygen plasma treatment for 5 minutes in plasma-preen unit prior to coating of the film. The film was spin-coated at 3000 RPM for 90 seconds and then dried in a nitrogen purge box for 5 minutes prior to UV exposure. The films were flood exposed using an i-liner OAI (345 nm) for 10 minutes. The various crosslinked films that resulted were tested for their Ag ink wetting. A 5 micro liter drop of DGP50 silver ink (Advanced NanoProducts, Soeul, Korea) was dispensed from a height of 1" above the surface of the film onto each of the surfaces of the various compositions. The drop was allowed to dry and the radius of the dry drop was then measured. The drop radius (in mm) as a function of fluorinated additive concentration is shown in Table 2 and FIG. 3 for the cases where fluorinated additives were not added to the compositions, the ink drop were observed to spread easily on the hydrophilic photopolymer surfaces. As the amount of fluorinated additive was increased, the film surfaces became progressively more hydrophobic and the radii of the drops became considerably smaller. As shown in Table 2 and FIG. 3, both the FTS and the Z225 fluorosurfactant additives were found to be particularly effective in rendering the polymer film surfaces more hydrophobic (diminished ink drop radii).

TABLE 1

|  | Weight % | grs |
|---|---|---|
| Kraton DKX | 73.5 | 7.35 |
| TMPEOTA | 19.5 | 2.4 |
| Perkodox 16 | 5 | 0.5 |
| GMA | 2 | 0.5 |

Kraton DKX, styrene butadiene styrene
TMPEOTA
Perkodox thermal initiator,
GMA glycidyl methacrylate

TABLE 2

|  | Drop radius (mm) | | |
|---|---|---|---|
| % Fluorination | Ex: 1-3 FTS | Ex 4-6 Z225 | Ex 6-9 FSN |
| 0.0100 | 23.00 | 22.00 | 24.00 |
| 0.1000 | 15.00 | 12.00 | 20.00 |
| 1.0000 | 6.000 | 5.000 | 17.00 |

Example 10-11

The following examples illustrate the ability to selectively ink only the desired areas of a bi-layer plate operating in a Gravure mode (top layer does not ink while the bottom layer inks). The ability to differentially ink was achieved as follows. Two photopolymer compositions with similar formulations, but one containing the fluorosurfactant additive Zonyl Z225 (Example 11) and the other devoid of the additive (Example 10), were prepared. The two compositions are defined in Table 3 below.

TABLE 3

|  | Bottom Layer | Ex-10 Top Layer (control) | Ex 11 Top Layer |
|---|---|---|---|
| Vector 4111A | 3.875 grs (77.5%) | 4.075 grs (81.5%) | 4.075 grs (81.5%) |
| CD501 | 0.875 grs (17.5%) | 0.875 grs (17.5%) | 0.85 grs (17.0%) |
| Irgacure 907 |  | 0.025 grs (0.5%) | 0.025 grs (0.5%) |
| ITX |  | 0.01 grs (0.2%) | 0.01 grs (0.2%) |
| TAOBN |  | 0.015 grs (0.3%%) | 0.015 grs (0.3%%) |
| Perkodox 16 | 0.25 grs (5%) |  |  |
| Zonyl Z225 |  |  | 0.05 grs (1%) |

Where,
Vector 4111A (Dexco Polymers LP, Houston, TX) is an styrene-isoprene-styrene block copolymer employed as a binder
Sartomer CD501 is a diacrylate monomer (Sartomer Co, Exton, PA)
Irgacure 907 is a photo-initiator
ITX is a photo-sensitizer (Ciba Specialty Chemicals, Basel, Switzerland)
TAOBN is an oxygen inhibitor (Stratford Research, Inc., Stratford, CT)
Zonyl Z225 is a fluorinated surfactant The bi-layer plates of Example 10 and Example 11 were fabricated onto clean 4" Si wafers. The wafers were first cleaned by an acetone rinse, followed by sequential methanol and DI-water rinses. The wafers were dried using a high pressure nitrogen gun. The wafers were then placed in an oxygen plasma using a Plasma Preen unit for 5 minutes. Bottom layers with compositions defined in column 2 of Table 3 were spin-coated at 3000 RPM for 90 seconds for both samples (Example 10 and Example 11). After completing the coating steps, the wafers were purged for 5 minutes in a nitrogen atmosphere and then flood-exposed for 10 minutes using an OAI 345 nm i-liner also under a nitrogen atmosphere. A second layer was then applied to each. For the control sample (Example 10) the composition of the top layer is defined in column 3 of Table 3. The composition of the top layer for Example 11 is defined by column 4 in Table 3 where 1% of the fluorosurfactant Zonyl Z225 has also been added. The top layers were spin-coated onto the crosslinked bottom layers at 3000 RPM for 90 seconds. The samples were allowed to dry in a nitrogen atmosphere for 2 minutes prior to exposure with an i-liner OAI at 345 nm. Exposures were made through a photomask for 5 minutes prior to the development of the upper layers to remove material from the non-exposed areas.

A soda lime glass-chrome patterned photomask was used to make ten 1 cm×2.5 cm test patterns. Each individual test pattern was ½ positive (clear features) and ½ negative (clear background). Within each negative and positive area were a series of rectangles and lines. 3 and 5 micron rectangles were alternated and were sized with 1:1, 1:3 and 1:5 aspect ratios. The lines were 0.25" in long and varied in width and spacing from 3 to 100 um. A neutral density filter with ten 1 cm×2.5 cm optical densities was aligned over the test patterns on the photomask. Thus a single exposure time would produce an exposure series. For example, a five minute exposure through an optical density of 0.01 corresponds to a 3 second exposure. This process allowed us to rapidly determine correct exposure time for each formulation as well as exposure latitude. After exposure was completed the sample was developed in Cylosol® for 2 minutes and dried by blowing it with a nitrogen gun.

The resolution of the resulting plates was analyzed via optical microcospy prior to inking. Both the control plate (Example 10) and fluorosurfactant containing plate (Example 11) were inked with a Ag nanoink DGP40 diluted 1:5 in alcohol. The ink was spin-coated onto the plate at 3000 RPM. The inked plates were then observed with an optical microscope and the areas that were inked and non-inked were determined both for the control and the fluorinated plates.

Microscopic analyses showed that while the control plate was coated by ink throughout the plate, the plate with the fluorine-containing top layer inked only in those regions were the top fluorinated layer was absent, thus exposing the relatively more hydrophilic bottom layer to the ink. Since the recess areas of this plate ink while its upper relief layer containing the fluorosurfactant additive does not ink, this bi-layer plate operates in a Gravure mode. Moreover, the recess lines ranging from 3 to 30 micrometers in size were inked while the relief lines that separated the recess lines were not inked. Inking of the image was very uniform and silver containing lines showed good electrical continuity as measured by a two-point probe. The large areas with rectangular relief and recess features were also inked. While the control (example 10) showed no inking differentiation, only the recessed regions of the plate were inked in Example 11.

Example 12-13

The following example illustrates the ability to selectively ink a bi-layer plate comprising a hydrophilic latex underlay and a fluorinated positive resist overlay. Two photopolymer compositions of essentially the same formulation but one with a fluorinated additive and the other without the additive were prepared. The compositions are shown in Table 4 below.

TABLE 4

|  | Bottom Layer A | Ex-12 Top Layer A (control) | Ex 13 Top Layer B |
|---|---|---|---|
| Vector 4111A | 3.75 grs (75%) | 3.75 grs (75%) | 3.75 grs (75%) |
| CD501 | 1.175 grs (23.5%) | 1.175 grs (23.5%) | 1.175 grs (23.5%) |
| Irgacure 907 | 0.05 grs (1.0%) | 0.05 grs (1.0%) | 0.05 grs (1.0%) |
| ITX | 0.01 grs (0.2%) | 0.01 grs (0.2%) | 0.01 grs (0.2%) |
| TAOBN | 0.015 grs (0.3%% | 0.015 grs (0.3%% | 0.015 grs (0.3%% |
| Zonyl FTS |  |  | 0.05 grs (1%) |

Where,
Vector 4111A an SIS block co-polymer is used as a binder
CD501 di-acrylate monomer
Irgacure 907 is a photo-initiator
ITX is a sensitizer
TAOBN is an oxygen inhibitor
Zonyl FTS is a fluorinated surfactant The bi-layer plates were fabricated onto a clean 4" Si wafer. The wafer was first clean with an acetone rinse, followed by sequential methanol and DI-water rinses. The wafer was then dried using high pressure nitrogen gun. The wafer was then placed in an oxygen plasma using a plasma preen unit for 5 minutes. The bottom layer with composition A was spun coated at 3000 RPM for 90 seconds for both samples; example 10 and example 11. After coating the wafers were purged for 5 minutes in a nitrogen atmosphere and flood exposed for 10 minutes using a OAI 345 nm i-liner also in a Nitrogen atmosphere. A second layer was then applied. On the control sample the composition of the top layer was identical to that in the bottom layer (columns 2 and 3 Table 3). On sample B the composition of composition of the top layer is that of column 4 in Table 3 above which only varies by the addition of 0.5% FTS relative to that of the bottom layer. The top layers were spun onto the crosslinked bottom layers at 3000 RPM for 90 seconds. The samples were let dry in a nitrogen atmosphere for 2 minutes prior to their exposure in an i-liner at 345 nm and exposed through a photomask for 5 minutes prior to its development.

The pattern in the photomasks (Chrome on glass) comprised 10 repeats of a basic pattern 1" in height and 0.5" in width; ½ positive (clear features) and ½ negative (clear background. This basic repeat unit comprised 3 and 5 micron patches as well as an assortment of lines and spaces. The features in the 5 microns patch all 5 microns in height vary in length from 5 to 50 microns. The features in the 3 micron patch all 3 microns in height vary in length from 3 to 30 microns. The line, 0.25" in length ranged from 3 to 100 microns in width; with spaces also varying in that range. This basic pattern area was repeated 10 times on the photomask. By placing a neutral density filter on top with areas of constant density that match the area of the underlying basic pattern, 10 different exposures could be obtained from a single exposure. That is, an optical density corresponds to a specific light transmission; thus an reduction in overall exposure time. For example, a 5 minute exposure through an neutral density filter with an OD of 0.01 corresponds to a 3 second exposure. Therefore by exposing through a 10 step filter we were able to rapidly determine the correct exposure for each formulation as well as the exposure latitude. After exposure was completed the sample was developed in Cylosol® for 2 minutes and dried by blowing it with a nitrogen gun.

The resolution of the plates was analyzed via optical microcospy prior to inking. Both the control and sample plates were ink with a Ag nanoink (ANP) DGP40 1:5 in alcohol. The ink was spun onto the plate at 3000 RPM. The inked plates were then observed in an optical microscope and areas that ink and did not ink determined both for the control and fluorinated plates. Results show that while the control plate inks throughout the plate, the sample with the fluorinated top layer inks only in those regions were the fluorinated layer was not exposed and was removed by the solvent, then exposing the hydrophilic bottom layer. Since these sample inks in the recess areas of the plate and not in the relief areas of the plate, these examples illustrate selective inking in a gravure mode.

The optical micrograph images illustrate that while recess and relief features ink in example 12 only the acrylic latex inks in example 13. The micrograph shows that the 10 microns recess lines inked while surrounding relief lines essentially did not. The image illustrates selective inking of various recess features 5 micron wide.

Example 14-17

The following example illustrates the ability to selectively ink a single layer fluorinated plate coated on a hydrophilic substrate. The ability to differentially ink was achieved as follows. The photopolymer compositions comprise various monomers whose preparations are listed in Table 5 below.

TABLE 5

|  | Example 14 | Ex-15 | Ex-16 | Ex-17 |
|---|---|---|---|---|
| 20% Kraton DKX in toluene | 19.75 grs (79%) | 19.75 grs 79% | 19.75 grs (79%) | 19.75 grs (79%) |
| Compound 1 | 0.97 grs (19.4%) | | | |
| Compound 2 | | 0.97 grs 19.4% | | |
| Compound 3 | | 0.40 (4%) | 0.97 grs 19.4% | |
| Compound 4 | | | | 0.97 grs 19.4% |
| Irgacure 907 | 0.5 | 0.001 grs (1%) | | |
| GMA | 0.05 grs (1%) | 0.05 grs (1%) | 0.05 grs (1%) | 0.05 grs (1%) |
| DPL | 0.025 grs (0.5%) | 0.025 grs (0.5%) | 0.025 grs (0.5%) | 0.025 grs (0.5%) |
| TAOBN | 0.0375 grs (0.075%) | 0.0375 grs (0.075%) | 0.0375 gr (0.075%) | 0.0375 gr 0.075% |
| Differential inking observed 1-5 (5 is highest) | 4 | 2 | 4 | 2 |
| Printing resolution obtained (microns) | 5 | 5 | 20 | 5 |

Where,
Kraton DKX222CS SBS block co-polymer is used as a binder
Compound 1 is a fluorinated linear dimethacrylate with a F/C ratio = 0.82
Compound 2 is a fluorinated branched dimethacrylate with a F/C ratio = 0.76
Compound 3 is a fluorinated linear dimethacrylate with a F/C ratio = 1.0
Compound 4 is a fluorinated linear dimethacrylate with a F/C ratio = 0.75
Irgacure 907 is a photo-initiator
DPL is lauryl 5-(N,N-diethylamino)-2-phenylsulfonyl-2,4-pentadienoate
TAOBN is an oxygen inhibitor The chemical structures and preparation of the four fluorinated dimethacrylates (compounds 1-4) with differing fluorine-to-carbon (F/C) ratios are described below.

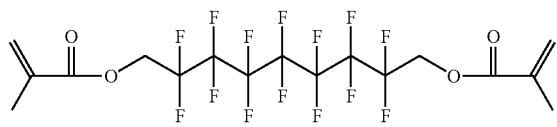 [SMILES: C=C(C)C(=O)OCC(F)(F)C(F)(F)C(F)(F)C(F)(F)C(F)(F)C(F)(F)C(F)(F)COC(=O)C(=C)C]

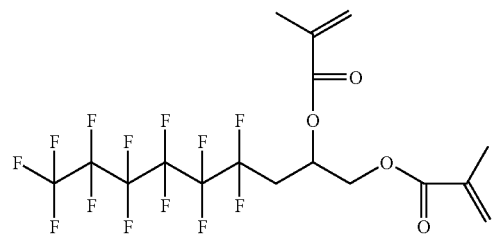 [SMILES: C=C(C)C(=O)OCC(CC(F)(F)C(F)(F)C(F)(F)C(F)(F)C(F)(F)C(F)(F)F)OC(=O)C(=C)C]

Preparation of the above di-methacrylate, Compound 1: A solution of 1H,1H,9H,9H-perfluoro-1,9-nonanediol (19.1 g, 46.3 mmol) and methacrylic anhydride (57.1 g, 370 mmol) in tetrahydrofuran (150 mL) was treated with sodium acetate (0.20 g) and 4-methoxyphenol (100 ppm). The resulting mixture was heated to reflux under a dried-air atmosphere for 48 hours and then cooled to room temperature. The tetrahydrofuran solvent was carefully removed under reduced pressure. The concentrated reaction mixture that remained was next diluted with ethyl ether (200 mL) and the resulting solution was rapidly stirred with 2% aqueous sodium carbonate (200 mL) for several hours to hydrolyze excess methacrylic anhydride reagent. The organic phase was separated and then sequentially washed with 2% sodium carbonate (100 mL), water (3×100 mL) and brine (50 mL). The organic phase was dried over anhydrous sodium sulfate, treated with 4-methoxyphenol (100 ppm) and then concentrated in vacuo to afford a clear, semi-viscous oil in 91% yield. Analysis of the product by FTIR revealed the absence of OH stretching near 3400 cm−1 and the presence of new signals at 1742 cm−1 (ester carbonyl) and 1638 cm−1 (methacrylate double bond). Proton NMR (CDCl3) spectroscopy confirmed the presence of terminal methacrylate groups in the product with resonances appearing near 6.2 and 5.8 ppm (methacrylate double bond) and 1.9 ppm (methacrylate methyl group). Theoretical flourine-to-carbon ratio=0.82

Preparation of the above di-methacrylate, Compound 2: A solution of 1H,2H,3H,3H-perfluorononane-1,2-diol (19.5 g, 49.5 mmol) and methacrylic anhydride (76.0 g, 493 mmol) in tetrahydrofuran (150 mL) was treated with sodium acetate (0.100 g) and 4-methoxyphenol (100 ppm). The resulting mixture was heated to reflux under a dried-air atmosphere for 48 hours and then cooled to room temperature. The tetrahydrofuran solvent was carefully removed under reduced pressure. The concentrated reaction mixture that remained was next diluted with ethyl ether (200 mL) and the resulting solution was rapidly stirred with 2% aqueous sodium carbonate (200 mL) for several hours to hydrolyze excess methacrylic anhydride reagent. The organic phase was separated and then sequentially washed with 2% sodium carbonate (100 mL), water (3×100 mL) and brine (50 mL). The organic phase was dried over anhydrous sodium sulfate, treated with 4-methoxyphenol (100 ppm) and then concentrated in vacuo to afford a clear, semi-viscous oil in 76% yield.

Analysis of the product by FTIR revealed the absence of OH stretching near 3400 cm−1 and the presence of new signals near 1750 cm−1 (ester carbonyl) and 1637 cm−1 (methacrylate double bond). Proton NMR (CDCl3) spectroscopy confirmed the presence of terminal methacrylate groups in the product with resonances appearing near 6.2 and 5.8 ppm (methacrylate double bond) and 1.9 ppm (methacrylate methyl group). Theoretical fluorine-to-carbon ratio=0.76.

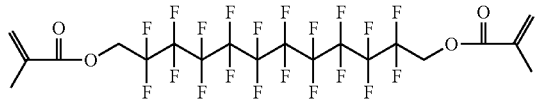 [SMILES: C=C(C)C(=O)OCC(F)(F)C(F)(F)C(F)(F)C(F)(F)C(F)(F)C(F)(F)C(F)(F)C(F)(F)C(F)(F)C(F)(F)COC(=O)C(=C)C]

Preparation of the above di-methacrylate, Compound 3: A solution of 1H,1H,12H,12H-perfluoro-1,12-dodecanediol (25.3 g, 45.0 mmol) and methacrylic anhydride (57.1 g, 370 mmol) in tetrahydrofuran (150 mL) was treated with sodium acetate (0.20 g) and 4-methoxyphenol (100 ppm). The resulting mixture was heated to reflux under a dried-air atmosphere for 48 hours and then cooled to room temperature. The tetrahydrofuran solvent was carefully removed under reduced pressure. The concentrated reaction mixture that remained was next diluted with ethyl ether (200 mL) and the resulting solution was rapidly stirred with 2% aqueous sodium carbonate (200 mL) for several hours to hydrolyze excess methacrylic anhydride reagent. The organic phase was separated and then sequentially washed with 2% sodium carbonate (100 mL), water (3×100 mL) and brine (50 mL). The organic phase was dried over anhydrous sodium sulfate, treated with 4-methoxyphenol (100 ppm) and then concentrated in vacuo to afford a clear, semi-viscous oil in 89% yield. Analysis of the product by FTIR revealed the absence of OH stretching near 3400 cm−1 and the presence of new signals at 1743 cm−1 (ester carbonyl) and 1638 cm−1 (methacrylate double bond). Proton NMR (CDCl3) spectroscopy confirmed the presence of terminal methacrylate groups in the product with resonances appearing near 6.2 and 5.8 ppm (methacrylate double bond) and 1.9 ppm (methacrylate methyl group). Theoretical flourine-to-carbon ratio=1.0.

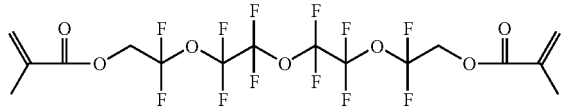 [SMILES: C=C(C)C(=O)OCC(F)(F)OC(F)(F)C(F)(F)OC(F)(F)C(F)(F)OC(F)(F)COC(=O)C(=C)C]

Preparation of the above di-methacrylate, Compound 4: A solution of 1H,1H,11H,11H-perfluoro-3,6,9-trioxaundecane-1,1'-diol (24.0 g, 58.5 mmol) and methacrylic anhydride (45.0 g, 292 mmol) in tetrahydrofuran (150 mL) was treated with sodium acetate (0.20 g) and 4-methoxyphenol (100 ppm). The resulting mixture was heated to reflux under a dried-air atmosphere for 48 hours and then cooled to room temperature. The tetrahydrofuran solvent was carefully removed under reduced pressure. The concentrated reaction mixture that remained was next diluted with ethyl ether (200 mL) and the resulting solution was rapidly stirred with 2% aqueous sodium carbonate (200 mL) for several hours to hydrolyze excess methacrylic anhydride reagent. The organic phase was separated and then sequentially washed with 2% sodium carbonate (100 mL), water (3×100 mL) and brine (50 mL). The organic phase was dried over anhydrous sodium sulfate, treated with 4-methoxyphenol (100 ppm) and then concentrated in vacuo to afford a clear, semi-viscous oil in 86% yield. Analysis of the product by FTIR revealed the absence of OH stretching near 3400 cm−1 and the presence of new signals near 1742 cm−1 (ester carbonyl) and 1638 cm−1 (methacrylate double bond). Proton NMR (CDCl3) spectroscopy confirmed the presence of terminal methacrylate groups in the product with resonances appearing near 6.2 and 5.8 ppm (methacrylate double bond) and 1.9 ppm (methacrylate methyl group). Theoretical fluorine-to-carbon ratio=0.75.

The printing plates in Examples 14-17 were fabricated on the acrylic side of a clean ST504 Melinex base (DuPont Teijin Films, Bristol, UK), which is highly hydrophillic. The base was first clean with a methanol rinse, followed by sequential DI water and isopropyl alcohol rinses. After a final rinse in DI water, the base was dried using high pressure nitrogen gun. The formulations were mixed overnight at room temperature and filtered through 1.5 um GMF filters. Each layer was spun onto the acrylic side of ST504 (DuPont Teijin Films, Bristol, UK) at 1000 RPM for 90 seconds and then exposed through a photomask for 10 minutes prior to its development in an OAI i-liner at 345 nm The pattern in the photomasks (Chrome on glass) comprised 10 repeats of a basic pattern 1" in height and 0.5" in width; ½ positive (clear features) and ½ negative (clear background. This basic repeat unit comprised 3 and 5 micron patches as well as an assortment of lines and spaces. The features in the 5 microns patch all 5 microns in height vary in length from 5 to 50 microns. The features in the 3 micron patch all 3 microns in height vary in length from 3 to 30 microns. The line and spaces, 0.25" in length ranged from 3 to 100 microns in width. This basic pattern area was repeated 10 times on the photomask. By placing a neutral density filter on top with areas of constant density that match the area of the underlying basic pattern, 10 different exposures could be obtained in a single experiment. That is, an optical density corresponds to a specific light transmission; thus a reduction in overall exposure time. For example, a 5 minute exposure through a neutral density filter with an OD of 0.01 corresponds to a 3 second exposure. Therefore by exposing through a 10 step filter we were able to rapidly determine the correct exposure for each formulation as well as the exposure latitude. After exposure was completed the sample was developed in toluene for 2 minutes and dried by blowing it with a nitrogen gun. The resolution of the plates (below, top right) was analyzed via optical microcopy prior to inking.

The sample plates were inked with a Ag nanoink DGP40 1:5 in alcohol. Where was the ink purchased from Advanced NanoProducts, Soeul, Korea. The ink was spun onto the plate at 3000 RPM. The inked plates were then observed in an optical microscope and areas that ink and did not ink determined. The plates have 3-5 micron resolution and selective inking can be achieved in the flexo mode. In compound 3, the high degree of fluorination led to modeling of the film surface with the lowering of the feature resolution. Compound 1 led to excellent resolution and selectivity of inking. As the fluorination was decreased, the selectivity decreased as well. Although small feature sizes were maintained the ink selectivity was not fully achieved.

Example 18-22

The following example illustrates the contact angle of the ink on plate formulations comprising various fluorinated monomers. The compositions and contact angles in water, toluene and ethanol are listed in Table 7 below.

The compositions in table 7, were stirred overnight at room temperature and coated on Si wafers. The wafer was first clean with an acetone rinse, followed by sequential methanol and DI-water rinses. The wafer was then dried using high pressure nitrogen gun. The wafer was then placed in an oxygen plasma using a Plasma Preen unit for 5 minutes. The films with the compositions of table 7 were spun coated at 1000 RPM for 90 seconds for both samples. The samples were let dry in a nitrogen atmosphere for 2 minutes prior to their flood exposure in an i-liner at 345 nm for 5 minutes development.

The contact angles with water, toluene and ethanol were measured with a VCA2500xe instrument manufactured by ASTProducts (Advanced Surface Technologies) in Billerica, Mass.

TABLE 7

|  | Control Ex. 18 | Ex-19 | Ex-20 | Ex-21 | Ex-22 |
|---|---|---|---|---|---|
| 20% Kraton DKX222 in toluene | 88% 22grs | 70% 17.5grs | 70% 17.5grs | 70% 17.5grs | 70% 17.5grs |
| Irgacure 907 | 1% 0.05grs | 1% 0.05grs | 1% 0.05grs | 1% 0.05grs | 1% 0.05grs |
| ITX | 1% 0.05grs | 1% 0.05grs | 1% 0.05grs | 1% 0.05grs | 1% 0.05grs |
| GMA | 10% 0.5grs | 10% 0.5grs | 10% 0.5grs | 10% 0.5grs | 10% 0.5grs |
| PFS |  | 18% 0.9grs |  |  |  |
| PFOA |  |  | 18% 0.9grs |  |  |
| PFHDA |  |  |  | 18% 0.9grs |  |
| VE-OPPVE |  |  |  |  | 18% 0.9grs |
| Adv. Contact angle in H2O | 98 | 101 | 103 | 89 | 108 |
| Adv. Contact angle in toluene | 18 | 54 | 21 | 18 | 56 |
| Adv. Contact angle in EtOH | wets | 33 | wets | wets | 25 |

Where,
Kraton DKX222CS is an SBS block is used as a binder
Irgacure 907 is a photo-initiator
GMA is glycidyl methacrylate
PFS is perfluorostyrene
PFOA is perfluorooctyl acrylate
PFHDA is perfluorohexyl di-acrylate
VE-OPPVE is 1,1,1,2,2,3,3-heptafluoro-3-(1,1,1,2,3,3-hexafluoro-3-(2-vinyloxy)ethoxy) propan-2-yloxy)propane
TX is a sensitizer.

In addition, the formulation of example 21 was also imaged through a photomask showing well defined lines, spaces and 3×3 μm, 3×9 μm and 3×15 μm features.

Scanning electron micrograph images showed the inking of the recess areas and not inking of the relief areas throughout the plate both for the rectangular features as well as for the 5 to 50 micron lines and spaces. The 3 micron height rectangles with length varying from 3 to 30 microns were inked throughout the 5 mm×5 mm pattern uniformly without any ink retention in the surrounding areas.

What is claimed is:

1. A printing form comprising:
   a) a substrate
   b) a first polymer layer disposed on the substrate wherein the first polymer layer comprises
      i) an elastomeric polymer;
      ii) an initiator; and
      iii) a monomer selected from non-fluorinated acrylate or methacrylate monomers;
   c) a second polymer layer disposed on the first polymer layer wherein the second polymer layer comprises
      i) an elastomeric polymer;
      ii) a photoinitiator; and
      iii) a monomer selected from a non-fluorinated acrylate or methacrylate monomers;
   wherein either the first or the second polymer layer, but not both, is hydrophilic, and the other polymer layer is hydrophobic, and only the polymer layer that is hydrophobic, but not both, comprises fluorinated additives, in an amount sufficient to render the layer hydrophobic.

2. The printing form of claim 1 wherein the elastomeric polymer is a block copolymer of styrene-butadiene-styrene or styrene-isoprene-styrene.

3. The printing form of claim 1 wherein the first polymer layer and the second polymer layer are crosslinked and each have an elastic modulus in the range of 10 to 100 MPa.

4. The printing form of claim 1 wherein the initiator in the first polymer layer is a photoinitiator or thermal initiator.

5. The printing form of claim 1, which is a flexographic printing plate.

6. The printing form of claim 1, which is a gravure printing plate.

7. The printing form of claim 1 wherein the fluorinated additives are fluorosurfactants.

\* \* \* \* \*